(12) United States Patent
Choi et al.

(10) Patent No.: US 7,732,010 B2
(45) Date of Patent: Jun. 8, 2010

(54) METHOD FOR SUPPORTING A GLASS SUBSTRATE TO IMPROVE UNIFORM DEPOSITION THICKNESS

(75) Inventors: Soo Young Choi, Fremont, CA (US); Beom Soo Park, San Jose, CA (US); Quanyuan Shang, Saratoga, CA (US); Robert I. Greene, Fremont, CA (US); John M. White, Hayward, CA (US); Dong-Kil Yim, Sungnam (KR); Chung-Hee Park, Seoul (KR); Kam Law, Union City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 718 days.

(21) Appl. No.: 11/406,136

(22) Filed: Apr. 18, 2006

(65) Prior Publication Data

US 2006/0185795 A1    Aug. 24, 2006

Related U.S. Application Data

(63) Continuation of application No. 10/435,182, filed on May 9, 2003, now abandoned.

(51) Int. Cl.
*C23C 16/00* (2006.01)

(52) U.S. Cl. ............... 427/248.1; 427/578; 156/345.51; 156/391; 118/723 R; 118/728

(58) Field of Classification Search ............... 427/248.1, 427/578; 156/345.51, 391; 118/723 R, 728
See application file for complete search history.

(56) References Cited

U.S. PATENT DOCUMENTS

| 3,019,522 A | 2/1962 | Bluth et al. |
| 3,616,310 A | 10/1971 | Dorsey, Jr. |
| 4,606,796 A | 8/1986 | Hanazima et al. |

(Continued)

FOREIGN PATENT DOCUMENTS

EP    0 803 900 A2    10/1997

(Continued)

OTHER PUBLICATIONS

Definition of "Corundum (emery)", Obtained from Hawley's Condensed Chemical Dictionary, 14$^{th}$ ed. At http://www.knovel.com on Apr. 30, 2005.

(Continued)

*Primary Examiner*—Bret Chen
(74) *Attorney, Agent, or Firm*—Patterson & Sheridan, LLP

(57) ABSTRACT

A method for supporting a glass substrate comprising providing a substrate support having an aluminum body, a substrate contact area formed on the surface of the substrate support, wherein the process of forming the substrate contact area comprises forming an anodization layer on a surface region of the aluminum body, the coating having a thickness of between about 0.3 mils and about 2.16 mils, wherein the surface region substantially corresponds to the substrate contact area, and preparing the anodization layer disposed over the surface region to a surface roughness between about 88 micro-inches and about 230 micro-inches, followed by anodizing the substrate surface to said thickness, positioning the substrate support adjacent a substrate processing region in a substrate processing chamber, wherein the substrate contact area is adjacent the substrate processing region, positioning the glass substrate on the substrate contact area.

8 Claims, 3 Drawing Sheets

U.S. PATENT DOCUMENTS

| | | | |
|---|---|---|---|
| 4,801,785 | A | 1/1989 | Chan et al. |
| 4,862,799 | A | 9/1989 | Hycner et al. |
| 4,974,369 | A | 12/1990 | Dixon |
| 5,104,514 | A | 4/1992 | Quartarone |
| 5,200,157 | A * | 4/1993 | Toya et al. ............ 118/730 |
| 5,290,424 | A | 3/1994 | Mozelewski et al. |
| 5,314,601 | A | 5/1994 | Hardee et al. |
| 5,366,585 | A | 11/1994 | Robertson et al. |
| 5,384,682 | A * | 1/1995 | Watanabe et al. ........ 361/234 |
| 5,401,573 | A | 3/1995 | Babel et al. |
| 5,565,058 | A | 10/1996 | Banholzer et al. |
| 5,581,874 | A * | 12/1996 | Aoki et al. ............ 29/825 |
| 5,675,471 | A | 10/1997 | Kotecki |
| 5,677,253 | A * | 10/1997 | Inoue et al. ............ 501/98.5 |
| 5,756,222 | A | 5/1998 | Bercaw et al. |
| 5,804,253 | A | 9/1998 | Hagiwara et al. |
| 5,811,195 | A | 9/1998 | Bercaw et al. |
| 5,844,205 | A * | 12/1998 | White et al. ............ 219/390 |
| 5,856,236 | A | 1/1999 | Lai et al. |
| 5,858,464 | A | 1/1999 | Littau et al. |
| 5,916,454 | A | 6/1999 | Richardson et al. |
| 6,007,673 | A | 12/1999 | Kugo et al. |
| 6,024,044 | A * | 2/2000 | Law et al. ............ 118/723 E |
| 6,055,927 | A | 5/2000 | Shang et al. |
| 6,063,203 | A * | 5/2000 | Satoh ............ 118/728 |
| 6,064,031 | A | 5/2000 | Talwar |
| 6,117,772 | A | 9/2000 | Murzin et al. |
| 6,159,301 | A * | 12/2000 | Sato et al. ............ 118/728 |
| 6,159,618 | A | 12/2000 | Danroc et al. |
| 6,196,001 | B1 | 3/2001 | Tannous et al. |
| 6,343,784 | B1 | 2/2002 | Jourde et al. |
| 6,355,554 | B1 | 3/2002 | Choi et al. |
| 6,368,880 | B2 | 4/2002 | Singhvi et al. |
| 6,423,175 | B1 | 7/2002 | Huang et al. |
| 6,458,683 | B1 | 10/2002 | Lee |
| 6,458,684 | B1 | 10/2002 | Guo et al. |
| 6,471,879 | B2 | 10/2002 | Hanson et al. |
| 6,510,888 | B1 * | 1/2003 | Matsumura et al. ....... 164/108 |
| 6,537,905 | B1 | 3/2003 | Chen et al. |
| 6,554,907 | B2 | 4/2003 | Beer et al. |
| 6,565,984 | B1 | 5/2003 | Wu et al. |
| 6,592,707 | B2 | 7/2003 | Shih et al. |
| 6,649,031 | B1 | 11/2003 | Iqbal et al. |
| 6,649,039 | B2 | 11/2003 | Hsu et al. |
| 6,659,331 | B2 | 12/2003 | Thach et al. |
| 6,672,917 | B2 | 1/2004 | Matsuda et al. |
| 6,713,188 | B2 | 3/2004 | Wu et al. |
| 6,775,873 | B2 | 8/2004 | Luoma |
| 6,776,873 | B1 | 8/2004 | Sun et al. |
| 6,841,049 | B2 * | 1/2005 | Ito et al. ............ 204/298.15 |
| 2002/0012022 | A1 | 1/2002 | Fassler et al. |
| 2002/0063108 | A1 | 5/2002 | Wang et al. |
| 2002/0148941 | A1 | 10/2002 | Sorokov et al. |
| 2002/0176219 | A1 * | 11/2002 | Sakaue et al. ............ 361/234 |
| 2003/0010446 | A1 | 1/2003 | Kajiyama et al. |
| 2003/0047464 | A1 | 3/2003 | Sun et al. |
| 2003/0150530 | A1 | 8/2003 | Lin et al. |
| 2003/0205479 | A1 | 11/2003 | Lin et al. |
| 2004/0129574 | A1 | 7/2004 | Kia et al. |
| 2004/0221959 | A1 | 11/2004 | Choi et al. |
| 2005/0037193 | A1 | 2/2005 | Sun et al. |
| 2006/0032586 | A1 | 2/2006 | Choi et al. |
| 2006/0159940 | A1 | 7/2006 | Bhatnagar et al. |
| 2006/0185795 | A1 | 8/2006 | Choi et al. |

FOREIGN PATENT DOCUMENTS

| | | |
|---|---|---|
| EP | 1 193 751 B1 | 5/2006 |
| JP | 03146672 A | 6/1991 |
| JP | 04083328 A | 3/1992 |
| JP | 5-163597 | 6/1993 |
| JP | 07-326655 | 12/1995 |
| JP | 9323234 | 12/1997 |
| JP | 10-340896 | 12/1998 |
| JP | 11-354620 | * 12/1999 |
| JP | 2001117079 | 4/2001 |
| JP | 2001298013 | 10/2001 |
| JP | 2002252276 | 9/2002 |
| KR | 2001-105389 | 11/2001 |
| KR | 2003-12050 | 2/2003 |
| KR | 2004-32489 | 4/2003 |
| SU | 1797027 | 2/1993 |
| TW | 541639 | 7/2003 |
| WO | WO 00/60658 | 10/2000 |
| WO | WO-01/71784 | 9/2001 |
| WO | WO-02/075790 | 9/2002 |

OTHER PUBLICATIONS

"Abrasive Grit Sizes" by Russ Rowlett, Obtained from http://www.unc.edu/-rowlett/units/scales/grit.html on Apr. 30, 2005.

First Office Action for Application No. 200410034739.0; Issued Aug. 11, 2006; People's Republic of China.

Second Office Action for Application No. 200410034739.0; Issued Jan. 12, 2007; People's Republic of China.

Chinese Third Office Action dated Apr. 27, 2007 for Chinese Application No. 200410034739.0.

European Office Action dated Feb. 15, 2007 for European Application No. 04011066.0-2119.

European Office Action dated Jul. 25, 2008 for European Application No. 04011066.0-2119.

European Office Action dated Nov. 21, 2007 for European Application No. 04011066.0-2119.

European Search Report dated Aug. 27, 2004 for European Application No. 04011066.0-2119.

Japanese Notice of Reasons for Rejection dated Jun. 17, 2008 for Japanese Application No. 2004-140365.

Korean Office Action dated Dec. 27, 2005 for Korean Application No. 200432489.

Korean Office Action dated Jul. 23, 2007 for Korean Application No. 20060070677.

Korean Office Action dated Nov. 10, 2006 for Korean Application No. 20060070677.

Taiwan Office Action dated Apr. 9, 2008 for Taiwan Application No. 093112801 with Taiwanese Search Report.

Taiwan Office Action dated Jul. 21, 2008 for Taiwan Application No. 95122556 with Taiwanese Search Report.

Taiwan Office Action dated Nov. 28, 2008 for Taiwan Application No. 093112801.

European Search Report for EP 04011066, dated Sep. 3, 2004.

Japanese Office Action, Patent Application No. 2004-140365, dated Feb. 24, 2009.

Summary of Office Action dated Aug. 17, 2009 for Taiwan Patent Application No. 95122556.

Search Report dated Aug. 11, 2009 for Taiwan Patent Application No. 95122556.

Lowenheim, Frederick, Modern Electroplating, Chapter 30, "Anodizing", pp. 632-641, 1942.

First Office Action dated Nov. 20, 2009 for Chinese Patent Application No. 200610098582.7.

* cited by examiner

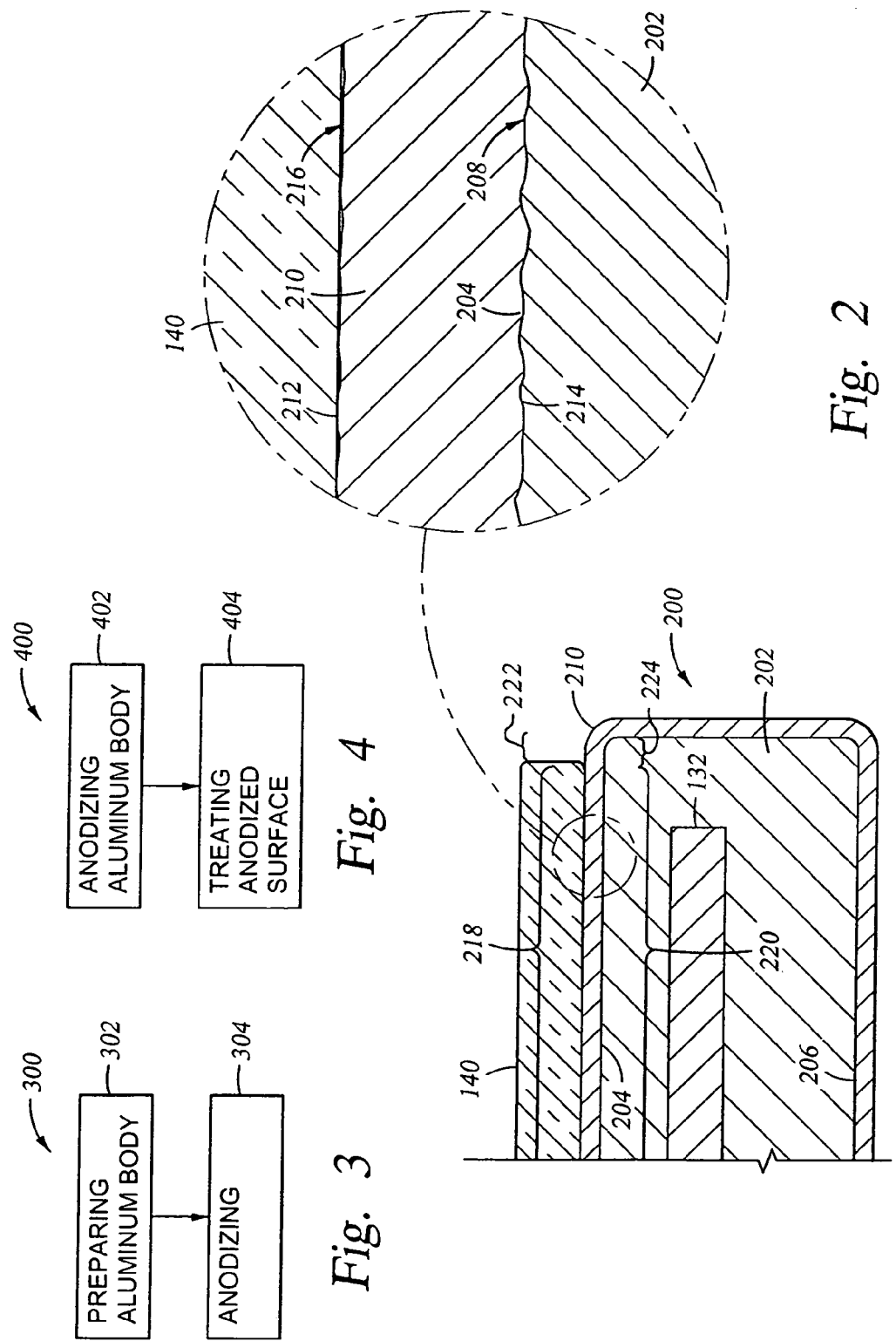

ional view of one embodiment of a processing chamber having a substrate support
METHOD FOR SUPPORTING A GLASS SUBSTRATE TO IMPROVE UNIFORM DEPOSITION THICKNESS

CROSS-REFERENCE TO RELATED APPLICATIONS

This application is a continuation of U.S. patent application Ser. No. 10/435,182, filed May 9, 2003 now abandoned.

BACKGROUND OF THE DISCLOSURE

1. Field of the Invention

Embodiments of the invention generally provide a substrate support utilized in semiconductor processing and a method of fabricating the same.

2. Description of the Background Art

Liquid crystal displays or flat panels are commonly used for active matrix displays such as computer and television monitors, personal digital assistants (PDAs), cell phones and the like. Generally, flat panels comprise two glass plates having a layer of liquid crystal material sandwiched therebetween. At least one of the glass plates includes at least one conductive film disposed thereon that is coupled to a power supply. Power supplied to the conductive film from the power supply changes the orientation of the crystal material, creating a pattern such as text or graphics seen on the display. One fabrication process frequently used to produce flat panels is plasma enhanced chemical vapor deposition (PECVD).

Plasma enhanced chemical vapor deposition is generally employed to deposit thin films on a substrate such as a flat panel or semiconductor wafer. Plasma enhanced chemical vapor deposition is generally accomplished by introducing a precursor gas into a vacuum chamber that contains a substrate. The precursor gas is typically directed through a distribution plate situated near the top of the chamber. The precursor gas in the chamber is energized (e.g., excited) into a plasma by applying RF power to the chamber from one or more RF sources coupled to the chamber. The excited gas reacts to form a layer of material on a surface of the substrate that is positioned on a temperature controlled substrate support. In applications where the substrate receives a layer of low temperature polysilicon, the substrate support may be heated in excess of 400 degrees Celsius. Volatile by-products produced during the reaction are pumped from the chamber through an exhaust system.

Generally, large area substrates utilized for flat panel fabrication are large, often exceeding 550 mm×650 mm, and are envisioned up to and beyond 4 square meters in surface area. Correspondingly, the substrate supports utilized to process large area substrates are proportionately large to accommodate the large surface area of the substrate. The substrate supports for high temperature use typically are casted, encapsulating one or more heating elements and thermocouples in an aluminum body. Due to the size of the substrate support, one or more reinforcing members are generally disposed within the substrate support to improve the substrate support's stiffness and performance at elevated operating temperatures (i.e., in excess of 350 degrees Celsius and approaching 500 degrees Celsius to minimize hydrogen content in some films). The aluminum substrate support is then anodized to provide a protective coating.

Although substrate supports configured in this manner have demonstrated good processing performance, small local variations in film thickness, often manifesting as spots of thinner film thickness, have been observed which may be detrimental to the next generation of devices formed on large area substrates. It is believed that variation is glass thickness and flatness, along with a smooth substrate support surface, typically about 50 micro-inches, creates a local capacitance variation in certain locations across the glass substrate, thereby creating local plasma non-uniformities that results on deposition variation, e.g., spots of thin deposited film thickness.

Aging and modifying plasma conditioning of the substrate support has shown to mitigate thin spot formation, particularly when performed in conjunction with an extended chamber vacuum purge before transferring a substrate into the chamber for processing. However, the resultant expenditures of time and materials required by this method and its unfavorable effect on cost and throughput make obtaining a more effective solution desirable.

As the size of next generation of substrates continues to grow, the importance of defect reduction becomes increasingly important due to the substantial investment by the flat panel manufacturer represented by each substrate. Moreover, with the continual evolution of device critical dimension reduction demanding closer tolerances for film uniformity, the reduction and/or elimination of film thickness variation becomes an important factor for the economic production of the next generation devices formed on large area substrates.

Therefore, there is a need for an improved substrate support.

SUMMARY OF THE INVENTION

A substrate support and method for fabricating the same are provided. In one embodiment of the invention, a substrate support includes an electrically conductive body having a substrate support surface that is covered by an electrically insulative coating. At least a portion of the coating centered on the substrate support surface has a surface finish of between about 80 to about 200 micro-inches. In another embodiment, a substrate support includes an anodized aluminum body having a surface finish on the portion of the body adapted to support a substrate thereon of between about 80 to about 200 micro-inches.

In another embodiment, a substrate support is fabricated by a process including the steps of providing an aluminum body suitable for supporting a large area substrate on a substrate support surface, and forming an anodized coating having a surface roughness of between about 80 to about 200 micro-inches on the substrate support surface.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

FIG. 2 is a partial sectional view of another embodiment of a substrate support assembly;

FIG. 3 is a flow diagram of one embodiment of a method for fabricating a substrate support assembly;

FIG. 4 is a flow diagram of another embodiment of a method for fabricating a substrate support assembly;

To facilitate understanding, identical reference numerals have been used, where possible, to designate identical elements that are common to the figures.

DETAILED DESCRIPTION

The invention generally provides a large area substrate support and methods for fabricating the same. The invention is illustratively described below in reference to a plasma enhanced chemical vapor deposition system, such as a plasma enhanced chemical vapor deposition (PECVD) system, available from AKT, a division of Applied Materials, Inc., Santa Clara, Calif. However, it should be understood that the invention has utility in other system configurations such as physical vapor deposition systems, ion implant systems, etch systems, other chemical vapor deposition systems and any other system in which processing a substrate on a substrate support is desired.

Figure 1:
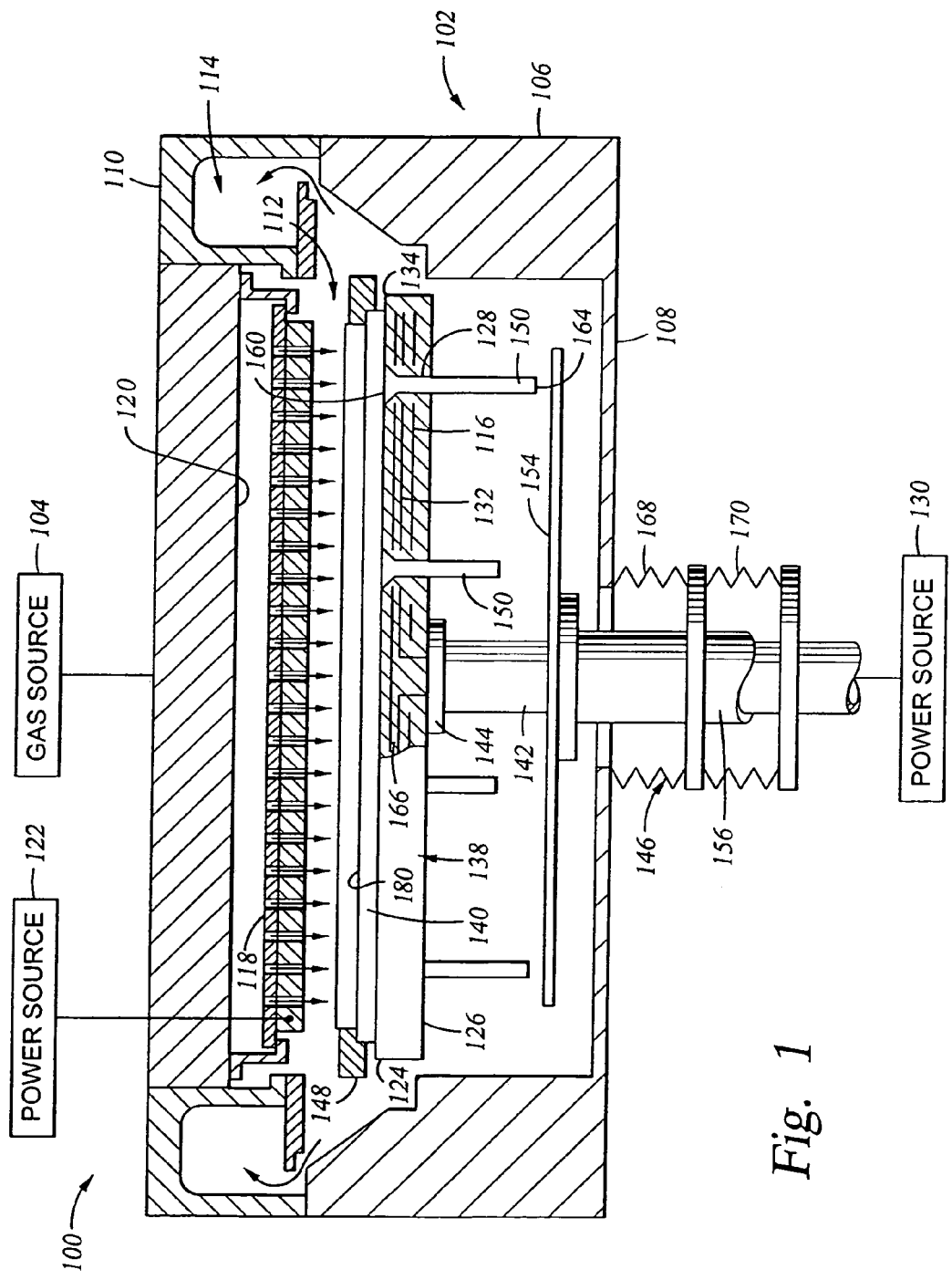
FIG. 1 depicts a schematic sectional view of one embodiment of a processing chamber having a substrate support assembly of the present invention.

FIG. 1 is a cross sectional view of one embodiment of a plasma enhanced chemical vapor deposition system 100. The system 100 generally includes a chamber 102 coupled to a gas source 104. The chamber 102 has walls 106, a bottom 108 and a lid assembly 110 that define a process volume 112. The process volume 112 is typically accessed through a port (not shown) in the walls 106 that facilitates movement of a large area glass substrate 140 into and out of the chamber 102. The walls 106 and bottom 108 are typically fabricated from an unitary block of aluminum or other material compatible for processing. The lid assembly 110 contains a pumping plenum 114 that couples the process volume 112 to an exhaust port (that is coupled to various pumping components, not shown).

The lid assembly 110 is supported by the walls 106 and can be removed to service the chamber 102. The lid assembly 110 is generally comprised of aluminum. A distribution plate 118 is coupled to an interior side 120 of the lid assembly 110. The distribution plate 118 is typically fabricated from aluminum. The center section includes a perforated area through which process and other gases supplied from the gas source 104 are delivered to the process volume 112. The perforated area of the distribution plate 118 is configured to provide uniform distribution of gases passing through the distribution plate 118 into the chamber 102.

A heated substrate support assembly 138 is centrally disposed within the chamber 102. The support assembly 138 supports the large area glass substrate 140 (herein after "substrate 140") during processing. The substrate support assembly 138 generally includes an electrically conductive body 124 that is covered with an electrically insulative coating 180 over at least the portion of the body 124 that supports the substrate 140. The coating 180 has a surface finish of about 80 to about 200 micro-inches that has been demonstrated to improve deposition uniformity without expensive aging or plasma treatment of the support assembly 138. The coating 180 may also cover other portions of the body 124. It is believed that the rougher surface offsets the effect of glass substrate thickness variation to provide a more uniform capacitance across the substrate, thereby enhancing plasma and deposition uniformity, and substantially eliminating the formation of thin spots in the deposited film.

The conductive body 124 may be fabricated from metals or other comparably electrically conductive materials. The coating 180 may be a dielectric material such as oxides, silicon nitride, silicon dioxide, aluminum dioxide, tantalum pentoxide, silicon carbide, polyimide, among others, which may be applied by various deposition or coating processes, including but not limited to, flame spraying, plasma spraying, high energy coating, chemical vapor deposition, spraying, adhesive film, sputtering and encapsulating.

In one embodiment, the substrate support assembly 138 includes an aluminum conductive body 124 that encapsulates at least one embedded heating element 132 and a thermocouple. At least a first reinforcing member 116 is generally embedded in the body 124 proximate the heating element 132. A second reinforcing member 166 may be disposed within the body 124 on the side of the heating element 132 opposite the first reinforcing member 116. The reinforcing members 116 and 166 may be comprised of metal, ceramic or other stiffening materials. In one embodiment, the reinforcing members 116 and 166 are comprised of aluminum oxide fibers. Alternatively, the reinforcing members 116 and 166 may be comprised of aluminum oxide fibers combined with aluminum oxide particles, silicon carbide fibers, silicon oxide fibers or similar materials. The reinforcing members 116 and 166 may include loose material or may be a pre-fabricated shape such as a plate. Alternatively, the reinforcing members 116 and 166 may comprise other shapes and geometry. Generally, the reinforcing members 116 and 166 have some porosity that allows aluminum to impregnate the members 116, 166 during a casting process described below.

The heating element 132, such as an electrode disposed in the support assembly 138, is coupled to a power source 130 and controllably heats the support assembly 138 and substrate 140 positioned thereon to a predetermined temperature. Typically, the heating element 132 maintains the substrate 140 at an uniform temperature of about 150 to at least about 460 degrees Celsius.

Generally, the support assembly 138 has a lower side 126 and an upper side 134 that supports the substrate. The lower side 126 has a stem cover 144 coupled thereto. The stem cover 144 generally is an aluminum ring coupled to the support assembly 138 that provides a mounting surface for the attachment of a stem 142 thereto.

Generally, the stem 142 extends from the stem cover 144 and couples the support assembly 138 to a lift system (not shown) that moves the support assembly 138 between an elevated position (as shown) and a lowered position. A bellows 146 provides a vacuum seal between the process volume 112 and the atmosphere outside the chamber 102 while facilitating the movement of the support assembly 138. The stem 142 additionally provides a conduit for electrical and thermocouple leads between the support assembly 138 and other components of the system 100.

The support assembly 138 generally is grounded such that RF power supplied by a power source 122 to the distribution plate 118 (or other electrode positioned within or near the lid assembly of the chamber) may excite the gases disposed in the process volume 112 between the support assembly 138 and the distribution plate 118. The RF power from the power source 122 is generally selected commensurate with the size of the substrate to drive the chemical vapor deposition process.

The support assembly 138 additionally supports a circumscribing shadow frame 148. Generally, the shadow frame 148 prevents deposition at the edge of the substrate 140 and support assembly 138 so that the substrate does not stick to the support assembly 138.

The support assembly 138 has a plurality of holes 128 disposed therethrough that accept a plurality of lift pins 150. The lift pins 150 are typically comprised of ceramic or anodized aluminum. Generally, the lift pins 150 have first ends 160 that are substantially flush with or slightly recessed from an upper side 134 of the support assembly 138 when the lift pins 150 are in a normal position (i.e., retracted relative to the support assembly 138). The first ends 160 are generally flared to prevent the lift pins 150 from falling through the holes 128. Additionally, the lift pins 150 have a second end 164 that extends beyond the lower side 126 of the support assembly 138. The lift pins 150 may be actuated relative to the support assembly 138 by a lift plate 154 to project from the upper side 134, thereby placing the substrate in a spaced-apart relation to the support assembly 138.

The lift plate 154 is disposed proximate the lower side 126 of the support surface. The lift plate 154 is connected to the actuator by a collar 156 that circumscribes a portion of the stem 142. The bellows 146 includes an upper portion 168 and a lower portion 170 that allow the stem 142 and collar 156 to move independently while maintaining the isolation of the process volume 112 from the environment outside the chamber 102. Generally, the lift plate 154 is actuated to cause the lift pins 150 to extend from the upper side 134 as the support assembly 138 and the lift plate 154 move closer together relative to one another.

FIG. 2 is a partial sectional view of one another embodiment of a support assembly 200. The support assembly 200 includes an aluminum body 202 substantially covered with an anodized coating 210. The body 202 may be comprised of one or more coupled members or an unitary casted body having the heating element 132 embedded therein. Examples of substrate support assemblies that may be adapted to benefit from the invention are described in U.S. patent application Ser. No. 10/308,385 filed Dec. 2, 2002, and Ser. No. 09/921,104 filed Aug. 1, 2001, both of which are hereby incorporated by reference in there entireties.

The body 202 generally includes a substrate support surface 204 and an opposing mounting surface 206. The mounting surface 206 is coupled to the stem 142 (seen in FIG. 1). The anodized coating 210 covers at least the support surface 204 of the body 202 and provides a separating layer between the substrate 140 and the support surface 204.

The coating 210 includes an outer surface 212 and an inner surface 214. The inner surface 214 is generally disposed directly on the body 202. In one embodiment, the anodized coating has a thickness of between about 0.3 to about 2.16 mils. Anodized coatings having a thickness falling outside of this range tend to either fail during temperature cycling or do not sufficiently reduce spotting in SiN, αSi and n+α-Si large area films formed by PECVD deposition.

A portion 218 of the outer surface 212 positioned above the substrate support surface 204 has a geometry configured to support the substrate 140 thereon. The portion 218 of the outer surface 212 has a surface finish 216 of a predefined roughness that promotes uniform thickness of films deposited on the substrate 140. The surface finish 216 has a roughness of about 80 to about 200 micro-inches. The surface finish 216 advantageously results in improved film thickness uniformity and particularly has been found to substantially eliminate local thickness non-uniformity (spots of thin deposition) without conditioning (e.g., aging) the substrate support. The elimination of substrate support conditioning conserves both time and materials normally consumed in a plasma aging process and eliminates vacuum purges between cycles, the elimination of which results in improved system throughput. In one embodiment, the surface finish 216 has a roughness of about 130 micro-inches.

The surface finish 216 of the anodized coating 210 may be achieved by treating at least a portion 220 of the outer substrate support surface 204 underlying the substrate 140 and/or by treating at least the anodized coating 210 that supports the substrate 140 (to obtain a pre-defined surface finish 208). The surface finish 208 of the substrate support surface 204 may be formed in a number of manners, including bead blasting, abrasive blasting, grinding, embossing, sanding, texturing, etching or other method for providing a pre-defined surface roughness. In one embodiment, the surface finish 208 of the support surface 204 of the body 202 is about 88 to about 230 micro-inches. In another embodiment, the surface finish 208 is about 145 micro-inches.

Optionally, a strip 224 of the support surface 204 bounding the portion 220 positioned out from under the substrate 140 may be left untreated to minimize the fabrication costs. This results in a strip 222 of the anodized coating 210 above the untreated strip 224 that may have a finish different than the finish 216, but as the strip 222 is beyond the substrate 140, the surface finish of the strip 222 has no effect on film deposition uniformity. In one embodiment, the strip 222 of the anodized coating 210 has a smoother surface finish than the portion 218 of the coating 210 it bounds.

FIG. 3 depicts one embodiment of a method 300 for fabricating the support assembly 138. The method begins at step 302 by preparing the support surface 204 of the body 202. The preparing step 302 generally entails working or otherwise treating the support surface 204 so that the finish 208 is between about 80 to about 200 micro-inches. In one embodiment, the preparing step 302 may include bead blasting, abrasive blasting, grinding, embossing, sanding, texturing, etching or other method for providing a pre-defined surface roughness, for example, about 130 micro-inches.

In one embodiment, the substrate support surface 204 is bead blasted to a pre-determined surface finish. Bead blasting may include impacting the body 202 with a ceramic or oxide bead.

In another embodiment, the bead is aluminum oxide, having an average diameter of about 125 to about 375 micron. The beads are provided through a nozzle having an exit velocity sufficient to produce a surface finish 208 of about 88 to about 230 micro-inches.

After the completion of the preparing step 302, the body is anodized at step 304. The anodizing step 304 generally includes applying an anodized layer having a thickness between about 0.3 to about 2.16 mils. The resultant surface finish 216 on the outer surface 212 of the anodized coating 212 is about 80 to about 200 micro-inches, and in one embodiment is about 130 micro-inches.

FIG. 4 depicts another embodiment of a method 400 of fabricating a support assembly 138. The method begins at step 402 by anodizing the aluminum body 202. At step 404, at least a portion 218 of the outer surface 212 of the anodized coating 210 is treated to provide a roughened surface finish 216. Alternatively, other portions of the outer surface 212 may be treated.

The treating step 404 may include bead blasting, abrasive blasting, grinding, embossing, sanding, texturing, etching or other method for providing a pre-defined surface roughness. In one embodiment, the treating step 404 results in a surface finish of the outer surface of about between about 80 to about 200 micro-inches.

Figure 5:
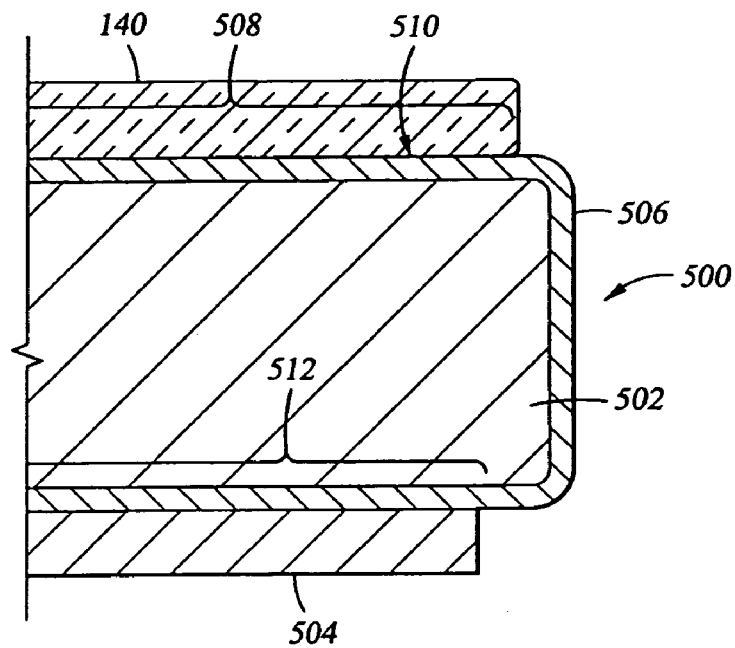
FIG. 5 is a partial sectional view of another embodiment of a substrate support assembly.

FIG. 5 depicts a partial sectional view of another embodiment of a support assembly 500 configured to enhance uniform deposition thickness. The support assembly 500 includes an aluminum support body 502 substantially encapsulated by an anodized coating 506. A heating element 504 is coupled to the support body 502 to control the temperature of the substrate 140 positioned on the upper surface of the support assembly 500. The heating element 504 may be a resistive heater or other temperature control device coupled to or disposed against the body 502. Alternatively, a lower portion 512 of the body 502 may be free from anodization to provide direct contact between the heating element 504 and the body 502. Optionally, an intervening layer (not shown) of thermally conductive material may be disposed between the heating element 504 and the lower portion 512 of the body 502.

An upper portion 508 of the anodized coating 506 that supports the substrate 140 has a surface finish 510 configured to enhance uniform deposition of films on the substrate 140. In one embodiment, the surface finish 510 has a roughness between about 80 to about 200 micro-inches. The surface finish 510 may be created through a number of methods, including the methods described above.

Figure 6:
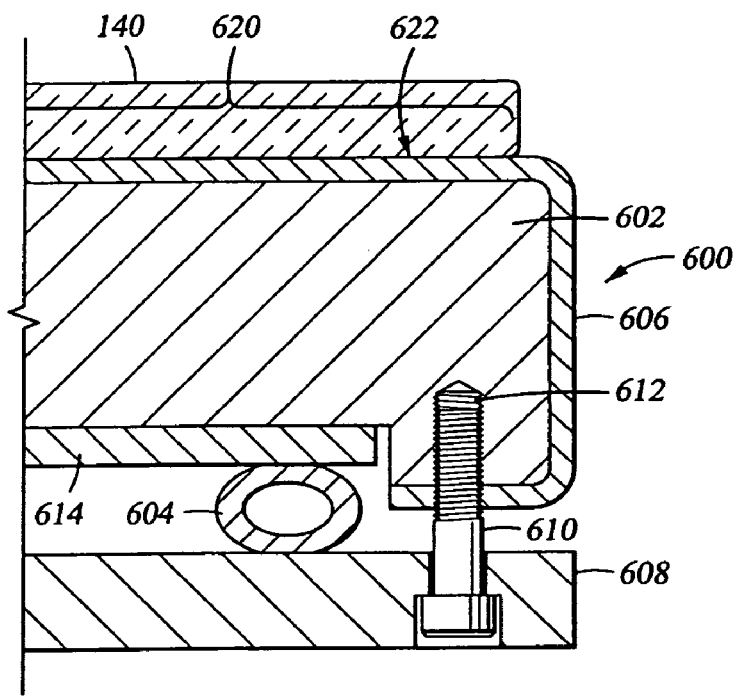
FIG. 6 is a partial sectional view of another embodiment of a substrate support assembly.

FIG. 6 depicts another embodiment of a heater assembly 600. The heater assembly 600 includes an aluminum body 602 having an anodized coating 606 at least partially formed thereon. A heating element 604, i.e., a conduit through which a temperature-controlled fluid is circulated, is disposed against a bottom surface of the body 602 to facilitate temperature control of the substrate 140. Optionally, a thermally conductive plate 614 may be disposed between the heating element 604 and the body 602 in order to enhance temperature uniformity between the heating element 604 and the body 602. In one embodiment, the intervening layer 614 is a copper plate.

A clamp plate 608 is coupled to the body 602 by a plurality of fasteners 610 (one of which is shown in FIG. 6) that thread into a threaded hole 612 formed in the body 602. The clamp plate 608 sandwiches the heating element 604 with the body 602, thereby enhancing heat transfer.

A portion 620 of the anodized coating 606 that supports the substrate 140 has a surface finish 622 configured to enhance uniform deposition of films on the substrate 140. The surface finish 622 may be created similar to that described above.

Thus, a support assembly that enhances uniform deposition of films disposed on a large area substrate is provided. At least a portion of an anodized coating covering the aluminum body of the support assembly which supports the substrate is textured to a pre-determined surface roughness that enhances deposition uniformity, thereby substantially eliminating time-consuming aging of the support assembly and its associated costs.

Although several preferred embodiments which incorporate the teachings of the present invention have been shown and described in detail, those skilled in the art can readily devise many other varied embodiments that still incorporate these teachings.

What is claimed is:

1. A method of supporting a glass substrate to improve uniform deposition thickness, comprising:
   providing a substrate support having:
      an aluminum body;
      a substrate contact area formed on the surface of the substrate support, wherein the process of forming the substrate contact area comprises:
         forming an anodization layer on a surface region of the aluminum body, the anodization layer having a thickness of between about 0.3 mils and about 2.16 mils, wherein the surface region substantially corresponds to the substrate contact area; and
         preparing the surface region to a surface roughness between about 88 micro-inches and about 230 micro-inches prior to the anodizing the substrate surface to said thickness;
   positioning the substrate support adjacent a substrate processing region in a substrate processing chamber, wherein the substrate contact area is adjacent the substrate processing region;
   positioning the glass substrate on the substrate contact area.

2. The method of claim 1, wherein the process of preparing the surface region consists essentially of bead blasting, grinding, embossing, sanding, texturing, etching, or combination thereof.

3. The method of claim 1, wherein the anodization layer is selected from the group consisting of silicon nitride, silicon dioxide, aluminum dioxide, tantalum pentoxide, silicon carbide and polyimide.

4. The method of claim 1, wherein the substrate contact area includes all areas of the surface of the substrate support that contact a substrate during processing.

5. The method of claim 1, wherein the substrate support contains at least one heating element.

6. The method of claim 1, wherein the substrate support further has a peripheral region adjacent the substrate contact area, the peripheral region having a surface roughness of less than about 130 micro-inches.

7. The method of claim 1, wherein the process of positioning the substrate support adjacent a substrate processing region comprises positioning the substrate support opposite a gas distribution plate.

8. The method of claim 5, further comprises disposing an intervening layer of thermally conductive material between the at least one heating element and a lower portion of the aluminum body.

* * * * *